United States Patent
Sonobe

(10) Patent No.: US 6,921,928 B2
(45) Date of Patent: Jul. 26, 2005

(54) NITRIDE SEMICONDUCTOR ELEMENT

(75) Inventor: Shinya Sonobe, Anan (JP)

(73) Assignee: Nichia Corporation, Anan (JP)

( * ) Notice: Subject to any disclaimer, the term of this patent is extended or adjusted under 35 U.S.C. 154(b) by 0 days.

(21) Appl. No.: 10/676,267

(22) Filed: Oct. 2, 2003

(65) Prior Publication Data

US 2004/0195579 A1 Oct. 7, 2004

(30) Foreign Application Priority Data

Aug. 27, 2002 (JP) ........................................ 2002-246573
Aug. 26, 2003 (JP) ........................................ 2003-300714

(51) Int. Cl.$^7$ .............................................. H01L 29/22
(52) U.S. Cl. ........................ 257/99; 257/13; 257/79; 257/80; 257/86; 257/94; 257/103; 257/184; 257/431; 257/432; 257/436
(58) Field of Search ............................. 257/13, 79–80, 257/86, 94, 103, 184, 431–432, 436, 99

(56) References Cited

U.S. PATENT DOCUMENTS

| | | | | |
|---|---|---|---|---|
| 5,807,774 A | * | 9/1998 | Desu et al. | 438/240 |
| 5,990,500 A | * | 11/1999 | Okazaki | 257/99 |
| 6,100,174 A | * | 8/2000 | Takatani | 438/605 |
| 6,139,780 A | * | 10/2000 | Desu et al. | 252/584 |
| 6,284,654 B1 | * | 9/2001 | Roeder et al. | 438/681 |
| 6,475,321 B1 | * | 11/2002 | Ikeda et al. | 156/230 |
| 2001/0015448 A1 | * | 8/2001 | Kawakubo et al. | 257/296 |
| 2003/0038294 A1 | * | 2/2003 | Sano | 257/91 |
| 2003/0162342 A1 | * | 8/2003 | Chen et al. | 438/199 |
| 2003/0209717 A1 | * | 11/2003 | Okazaki | 257/80 |
| 2003/0227065 A1 | * | 12/2003 | Senda et al. | 257/432 |
| 2004/0229429 A1 | * | 11/2004 | Nagano et al. | 438/253 |

FOREIGN PATENT DOCUMENTS

| | | | | |
|---|---|---|---|---|
| JP | 11-274562 A | | 10/1999 | |
| JP | 2000-299528 A | | 10/2000 | |
| JP | 2001147223 A | * | 5/2001 | ............ G02B/5/08 |

* cited by examiner

*Primary Examiner*—Amir Zarabian
*Assistant Examiner*—Ida M. Soward
(74) *Attorney, Agent, or Firm*—Smith Patent Office

(57) ABSTRACT

In the nitride semiconductor device having a p-type nitride semiconductor layer, an electrode including at least rhodium and iridium is formed on the p-type nitride semiconductor layer. By this construction, an excellent ohmic contact between the electrode and the p-type nitride semiconductor layer and a high reflectivity in the electrode can be obtained, so that the nitride semiconductor device having excellent external quantum efficiency can be provided.

10 Claims, 9 Drawing Sheets

FIG. 1

| 1st Layer | Rh | Rh | Rh | Rh | Rh |
|---|---|---|---|---|---|
| 2nd Layer | Null | Ir | Pt | Ru | Au |
| Specific Contact Resistivity | 1.00 | 0.40 | 1.10 | 1.00 | 0.54 |

NITRIDE SEMICONDUCTOR ELEMENT

BACKGROUND OF THE INVENTION

1. Field of the Invention

The present invention relates to a device comprising a nitride semiconductor ($In_xAl_yGa_{1-x-y}N$, $0 \leq X$, $0 \leq Y$, $X+Y \leq 1$) and particularly to an electrode formed on a p-type nitride semiconductor layer.

2. Discussion of the Related Art

Nitride semiconductors have been used for light emitting devices such as light emitting diode (LED) and laser diode (LD), light receiving devices such as solar batteries and optical sensors, and electronic devices such as transistors and power devices. Especially, light emitting diodes utilizing a nitride semiconductor have been widely used in a traffic signal, a large-scale display, and a back light source etc. The light emitting diodes utilizing a nitride semiconductor are also suitably used in an image scanner, in a media such as DVD as a light source for an optical disc etc. which stores large information, for a light source in a communication system, in a printing equipment, in a light source for a lighting, and so forth. The nitride semiconductor described above is specifically comprised of $Al_xIn_yGa_{1-x-y}N$ ($0 \leq x$, $0 \leq y$, $x+y<1$).

This nitride semiconductor light emitting diode basically has a structure where an n-type nitride semiconductor layer, an active layer, and a p-type nitride semiconductor layer are laminated in sequence on an insulating substrate such as sapphire. Because an electrode cannot be formed on the rear face of the substrate, an n-electrode is disposed on the n-type nitride semiconductor layer which is exposed by a partial etching from the p-side nitride semiconductor layer side, and the p-electrode is formed on the remaining p-type nitride semiconductor layer which was not subjected to the etching. That is, the p-electrode and the n-electrode are disposed on the same face where the semiconductor layer is laminated. The device having such a structure emits light with the wavelength mainly shorter than 550 nm.

Although the resistance of the p-type nitride semiconductor layer is lowered by annealing or electron beam irradiation etc., the resistance is still higher than the resistance of the n-type nitride semiconductor layer, and the electric current doesn't spread easily in the p-type nitride semiconductor layer. Therefore, the p-electrode is formed on the entire face of the p-type nitride semiconductor layer. By this construction, the electric current is spread out the entire surface of the p-type semiconductor layer, and a uniform distribution of emission is obtained. When the side where the semiconductor layer is laminated is made to an observation side, the emission is blocked by the p-electrode. By this reason, a transparent electrode is used for the p-electrode and the emission is extracted through the p-electrode.

Here, a film electrode that contains nickel (Ni) and gold (Au) has an excellent ohmic contact with the p-type nitride semiconductor layer and has a transparent property, so that it is desirably used as a p-electrode, as described in Japanese Unexamined Patent Publication No. 2000-299528.

However, an electrode that contains gold (Au) absorbs light having shorter wavelength than 550 nm. Consequently, there has been a problem when the electrode containing gold is used for the p-electrode, a major portion of light is absorbed by the p-electrode and a sufficient amount of light can not be extracted.

Rhodium (Rh) can be cited as a material capable of solving such a problem. Rhodium is known to have a preferable reflectivity in the region from ultraviolet to infrared. Moreover, Rhodium has ideal physical properties as the electrode for a light emitting device and a light receiving device, such as low electrical resistivity, and excellent heat resistance and corrosion resistance. However, because rhodium has a large contact resistance against a nitride semiconductor, there was a need to improve the contact resistance so as to be used in a light emitting device, as described in Japanese Unexamined Patent Publication No. H11-274562.

The present invention has been made in order to solve the above problems and an object of this invention is to provide a nitride semiconductor device having a good external quantum efficiency, by reducing the light absorption in the electrode formed on the p-type nitride semiconductor layer.

SUMMARY OF THE INVENTION

The nitride semiconductor device according to the present invention includes at least a p-type nitride semiconductor layer and an electrode including at least rhodium and iridium is formed on the p-type nitride semiconductor.

Moreover, the electrode has a two-layer structure where rhodium is laminated in contact with the p-type nitride semiconductor layer, and iridium is laminated thereon.

The thickness of the rhodium layer in the two-layer structure is from equal or greater than 10 Å to equal or less than 1000 Å in a nitride semiconductor device described in claim 1 or 2.

Moreover, the electrode has been annealed at equal or greater than 300° C.

As described above, according to the present invention, the electrode formed on the p-side nitride semiconductor layer includes at least rhodium and iridium, so that the electrode has a good ohmic contact with the p-type nitride semiconductor layer and has a high reflectivity. Therefore, the losses of light and electric power in the electrode are reduced and the nitride semiconductor device having good external quantum efficiency can be provided.

BRIEF DESCRIPTION OF THE DRAWINGS

FIG. 1 is a table showing the specific contact resistivity (ratio when Rh is assumed to be one) measured by using the TLM technique.

DETAILED DESCRIPTION OF THE PREFERRED EMBODIMENTS

Embodiment 1

Figure 2:
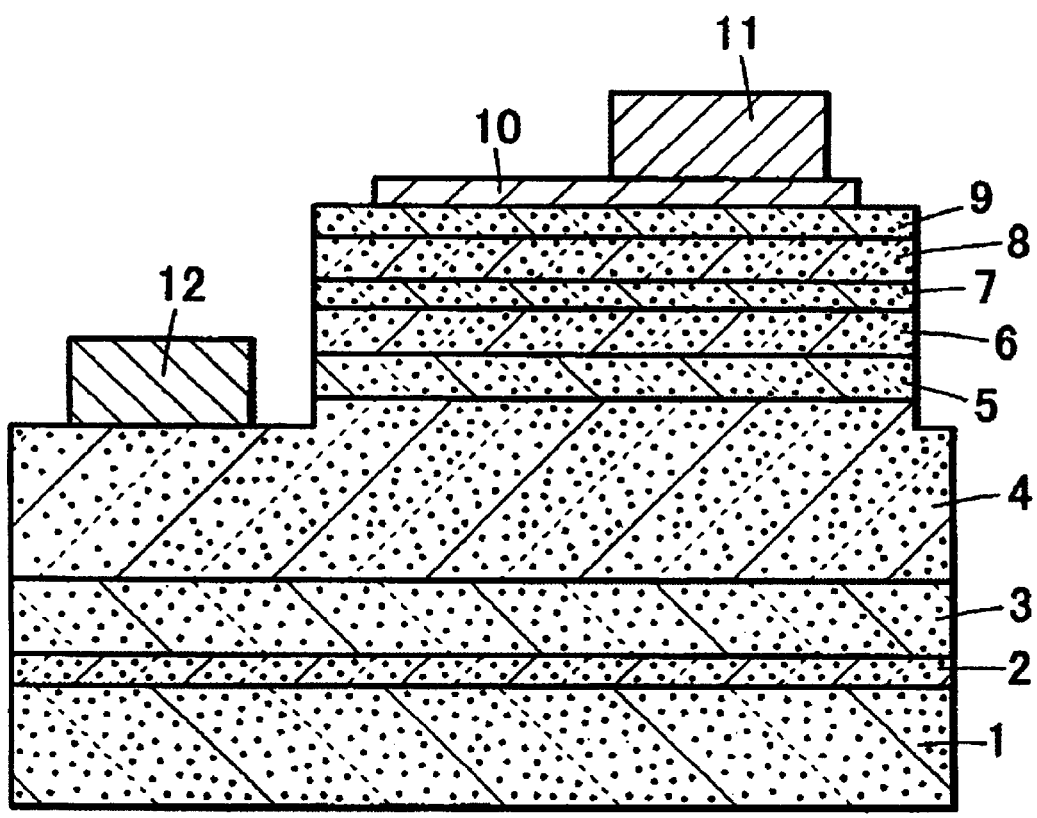
FIG. 2 is a schematic cross-sectional view showing the nitride semiconductor device according to an embodiment of the present invention.

Now, preferred embodiments in accordance with the present invention will be described in detail.

A nitride semiconductor element according to the present invention comprises at least a p-type nitride semiconductor layer, and an electrode including at least rhodium (Rh) and iridium (Ir) is formed on the p-type nitride semiconductor layer as schematically shown in FIG. 1 and described in further detail later.

The electrode including at least rhodium and iridium in the present invention is an alloy or a layer comprising rhodium and iridium. Other materials may be included in the electrode in the range where the material does not affect adversely to the ohmic contact between the electrode and the p-type nitride semiconductor layer, the reflectivity of the electrode, etc.

Although the electrode that includes either rhodium or iridium has a high reflectivity, sufficient ohmic contact with the p-type nitride semiconductor layer can not be obtained, therefore, both of rhodium and iridium are needed to be used in combination. The electrode formed with such a composition obtains an excellent ohmic contact with p-type nitride semiconductor layer and has a high reflectivity, so that the absorption of light in the electrode decreases, and the nitride semiconductor device with good external quantum efficiency can be provided.

Moreover, because an electrode that includes gold absorbs light having shorter wavelength than 550 nm, and decreases reflectivity of the electrode, it is desirable not to include gold in the electrode material. Although an electrode that includes nickel has a good ohmic contact with the p-type nitride semiconductor layer, the electrode that includes nickel in addition to rhodium and iridium can not obtain sufficient ohmic contact with the p-type nitride semiconductor layer and decreases the reflectivity of the electrode, so that it is desirable not to be included in the electrode material. For the same reason, it is desirable not to include cobalt and titanium etc. in the electrode material. However, this is not specifically limited when the above elements are used for a pad electrode formed on an electrode made of Rh/Ir.

In the present invention, it is preferable that the electrode has at least two-layer structure, where the iridium layer is laminated on the rhodium layer which is laminated in contact with the p-type nitride semiconductor layer. With this construction, the most desirable ohmic contact between the electrode and p-type nitride semiconductor layer can be obtained. Moreover, because the reflectivity of rhodium is higher than that of iridium, the reflectivity of the electrode can be made higher by laminating the rhodium layer in contact with the p-type nitride semiconductor layer.

Here, the thickness of the rhodium layer is not limited. However, it is preferable to adjust the thickness within the range of 10 to 1000 angstroms, and more preferably, within the range of 100 to 500 angstroms. Also, the thickness of the iridium layer is not limited. However, it is preferable to adjust the thickness within the range of 10 to 1000 angstroms, more preferably within the range of 100 to 500 angstroms, and most preferably within the range of 300 to 500 angstroms.

It is preferable to adjust the film thickness within such a range, because an excellent ohmic contact can be obtained between the electrode and the p-type nitride semiconductor layer, and the reflectivity of the electrode increases.

Moreover, in the case where the two-layer structure of rhodium/iridium is formed on the p-type nitride semiconductor layer, it is preferable to adjust the entire thickness of the electrode within the range of 500 to 1000 angstroms. The absorption of light tends to increase in a thinner electrode, and the ohmic contact between the electrode and the p-type nitride semiconductor layer tends to become insufficient in a thicker electrode than described above. In those cases, light can not be extracted through the p-electrode, however, light can be extracted from the substrate side and the end face side of the device. Therefore, the light extracting efficiency can be improved in consequence of reducing the light absorption in the p-electrode. Furthermore, due to the device process, there is a risk of crack to occur at the interface between the semiconductor layer and the electrode described above.

Also, in the case where three or more layers of the above-described p-electrode are formed on the above-described p-type nitride semiconductor layer, it is preferable to adjust the entire thickness of the electrode in the range of 500 to 3000 angstroms, more preferably, in the range of 800 to 2000 angstroms. This electrode structure can be used for the semiconductor device having a counter electrode structure capable of loading a large current. One such example is a structure of P-type nitride semiconductor layer/rhodium/iridium/platinum (Pt). As a substitute material for platinum, other elements in platinum group and a high melting point material can be used. The above-mentioned high melting point material is at least one selected from Ti, Zr, Hf, V, Nb, Ta, Mo, and W. Here, the light extract face of the semiconductor device is the n-type nitride semiconductor layer side.

In addition, it is preferable in the current invention that the electrode has been annealed at 300° C. or more. By this, the contact resistance between the electrode and the p-type nitride semiconductor layer can be further lowered, the ohmic contact becomes more excellent, and the adhesion of the electrode and the p-type nitride semiconductor layer strengthens. The annealing atmosphere is not specifically limited, and nitrogen, oxygen, or an inert gas such as argon, or atmospheric conditions can be used suitably.

In the nitride semiconductor device according to the present invention, the structure other than the p-type nitride semiconductor layer is not specifically limited. The entire nitride semiconductor device can be constructed with the nitride semiconductor, or the materials other than the nitride semiconductor. A semiconductor made of GaN, AlN, InN, $In_XAl_YGa_{1-X-Y}N$ ($0 \leq X$, $0 \leq Y$, $X+Y \leq 1$), or the mixed crystal thereof, can be used as the nitride semiconductor. In addition, B can be used as a Group III element, and N can be substituted partially by P or As as a Group V element.

The p-type nitride semiconductor layer in the present invention is a nitride semiconductor layer showing the p-type conductivity. Because the nitride semiconductor layer which is not doped with an impurity (undoped) shows the n-type conductivity, the nitride semiconductor layer came to show the p-type conductivity by doping with a p-type impurity is included herein. The p-type impurity is not specifically limited, and the Group II elements such as magnesium (Mg), zinc (Zn), and cadmium (Cd) can be used suitably. Especially, magnesium is desirable because a p-type nitride semiconductor layer having a low-resistance can be obtained easily.

However, during crystal growth, hydrogen is contained in the p-type nitride semiconductor layer and combined with the p-type impurity, and the p-type impurity is inactivated. Thus the p-type nitride semiconductor layer has a higher resistance than that of the n-type nitride semiconductor layer. Therefore, it is preferable to remove hydrogen from the p-type semiconductor layer by a method such as annealing in an atmosphere of substantially hydrogen-free, to make the layer further low-resistance. When annealing is carried out after forming the electrode, annealing for lowering resistance can be done concurrently.

The composition of the p-type nitride semiconductor layer is not specifically limited, however, $Al_zGa_{1-z}N$ ($0 \leq Z \leq 1$) is preferable, and GaN is more preferable. $Al_zGa_{1-z}N$ ($0 \leq Z \leq 1$) can be formed with excellent crystallinity, and especially, GaN can be formed easily with low resistance among P-type nitride semiconductors, so that the ohmic contact with the electrode can be obtained with ease.

Moreover, a pad electrode can be further formed on the electrode in the present invention. The material for the pad electrode is not specifically limited, however, it is preferable to laminate gold on the top of the pad electrode. By this, excellent adhesion with a ball etc. formed by the wire bonding can be obtained.

The method for forming the electrode is not specifically limited and CVD, deposition, and sputtering etc. can be suitably used. Also, the electrode can be formed at the desired position with the desired shape by way of etching using the photolithography, liftoff, and the like.

Because the p-type nitride semiconductor layer has a higher resistance compared with the n-type nitride semiconductor layer, the electric current doesn't spread easily in the p-type nitride semiconductor layer. Therefore, it is preferable to form the electrode on the entire surface of the p-type nitride semiconductor layer. By this construction, the electric current spreads to the entire surface of the p-type nitride semiconductor layer and the uniform emission distribution can be obtained.

In the present invention, hydrogen doesn't easily penetrate through the electrode because the film thickness of the electrode cannot be reduced so much. Therefore, it is preferable to form the electrode in dots, stripes, or grids so that hydrogen penetrates out from the openings, and the resistance of the p-type nitride semiconductor layer can be decreased with ease. Moreover, the light extract efficiency can be further improved because light can be extract through the openings.

In the present invention, the growing method of the nitride semiconductor is not specifically limited, and any of known growth methods of a nitride semiconductor can be suitably used. Such methods are MOVPE (metallorganic vapor phase epitaxy), MOCVD (metalorganic chemical vapor deposition), HVPE (halide vapor phase epitaxy), and MBE (molecular beam epitaxy) and the like. Especially, MOCVD is preferable because an excellent crystallinity can be obtained by this method. Also, it is desirable that the nitride semiconductor is grown by a method selected from various growth methods of a nitride semiconductor, according to the objective.

The details of each component and process of the present invention will be described in the following with reference to FIGS. 2 to 4. The substrate 1 only has to be a substrate capable of forming a nitride semiconductor by epitaxial growth. The substrate may be an insulating substrate such as sapphire having either c-face, r-face, or a-face as a principle surface, or spinel ($MgAl_2O_4$), silicon carbide (6H, 4H, 3C), silicon, ZnS, ZnO, Si, GaAs, diamond, or an oxide substrate which lattice matches with a nitride semiconductor such as lithium niobate and neodium gallate, and the like.

In addition, if the film thickness is enough for the device to be processed (several dozen μm and above), a nitride semiconductor substrate such as GaN and AlN can be used.

The substrate may be at the off-angled position. In the case where a sapphire c-face is used for the substrate, the off-angle is adjusted in the range of 0.01° to 3.0°, preferably 0.03° to 0.5°.

A recess and/or a protrusion can be formed on the above-mentioned substrate. The planar shape of the circumference of the recess and/or the protrusion is a polygon or a circle, and preferably is a circle, a triangle, a parallelogram, or a hexagon. The light extraction efficiency can be improved by using the above-mentioned substrate for the above-mentioned semiconductor element.

Moreover, when the recess and the protrusion are formed with the above-mentioned planar shape, the occurrence of pit etc. can be prevented. An equilateral triangle, a diamond, or an equilateral hexagon is more preferable. Also, a circle is preferable. If the planar shape is a circle, the occurrence of pit can be greatly prevented. Moreover, the planar shape of the recess and the protrusion is not necessary to be a complete geometrical polygon, and may have a rounded corner for the reasons for the processing etc.

The depth of the recess or the difference of the protrusion is 100 Å and above, and preferably from 1000 to 10000 Å. This is because when the emission wavelength (for example, in the case of AlGaIn emission layer is 206 nm to 632 nm) is assumed to be λ, it is impossible to scatter or diffract light sufficiently without having the depth of the recess or the difference of the protrusion λ/4 and above. On the other hand, when the depth of the recess or the difference of the protrusion exceeds the above-mentioned range, the lateral electric current become difficult to flow in the laminated structure, and the emission efficiency decreases. Moreover, the tilt angle θ of the slope constructing the protrusion is preferably 45 Å and above to 80 Å and below, and more preferably 50 Å and above to 70 Å and below.

The general formula of the nitride semiconductor is $In_xAl_yGa_{1-x-y}N$ ($0 \leq x$, $0 \leq y$, $x+y \leq 1$) which may be a mixed crystal including B, P or As. Also, a single layer or a multiple layer can be suitably selected for the n-type nitride semiconductor layer and the p-type nitride semiconductor layer.

In addition, an n-type impurity or a p-type impurity can be included according to the function of each layer in the nitride semiconductor layer. A Group Iv element or a Group VI element such as Si, Ge, Sn, S, O, Ti, and Zr can be used as an n-type impurity. Si, Ge, and Sn are used preferably, and Si is used most preferably.

Moreover, as a p-type impurity, Be, Zn, Mn, Cr, Mg and Ca etc. are used, and Mg is used preferably. Thus, the nitride semiconductors of each conductive type can be formed. The nitride semiconductor layer includes an active layer of a single quantum well (SQW) structure or a multiple quantum well (MQW) structure.

The construction of the nitride semiconductor is described in the following. The nitride semiconductor is grown on the above-mentioned substrate through a buffer layer 2. For the buffer layer, a nitride semiconductor represented by a general formula $Al_aGa_{1-a}N$ ($0 \leq a \leq 0.8$), more preferably a nitride semiconductor represented by a general formula $Al_aGa_{1-a}N$ ($0 \leq a \leq 0.5$) is used. The thickness of the buffer layer is preferably from 0.002 to 0.5 μm, more preferably from 0.05 to 0.2 μm, and further preferably from 0.01 to 0.02 μm. The growth temperature of the buffer layer is preferably from 200 to 900° C., more preferably from 400 to 800° C. By this construction, the occurrence of dislocation or pit on the nitride semiconductor layer can be reduced. Moreover, an $Al_xGa_{1-x}N$ ($0 \leq X \leq 1$) layer 3 may be grown on the above-mentioned substrate by ELO (Epitaxial Lateral Overgrowth) method. By this ELO (Epitaxial Lateral Overgrowth) method, the nitride semiconductor is grown in the lateral direction so that the threading dislocations are bent and converged. As a result, the number of dislocations is reduced.

The semiconductor device according to the present invention can provide a laser diode with a high output power by combining the above-mentioned buffer layer and the ELO layer. The buffer layer can be a multilayer structure, and a high-temperature growth layer may be formed on a low-temperature growth buffer layer.

For a high-temperature growth layer, undoped GaN or GaN doped with an n-type impurity can be used. The thickness of the high-temperature growth layer is equal or more than 1 $\mu$m, preferably equal or more than 3 $\mu$m. Also, the growth temperature of the high-temperature growth layer is from 900 to 1100° C., preferably equal or higher than 1050° C. The buffer layer 2 and the $Al_xGa_{1-x}N$ ($0 \leq X \leq 1$) layer 3 can be omitted depending on the substrate 1.

Next, the n-type nitride semiconductor layer is grown. First, an n-type contact layer 4 is grown. $Al_jGa_{1-j}N$ ($0 \leq j < 0.3$), whose composition provides a larger bandgap energy than that of the active layer, is preferable for the n-type contact layer. The thickness of the n-type contact layer is not specifically limited, however, it is preferably equal or greater than 1 $\mu$m, and more preferably equal or greater than 3 $\mu$m. Next, a first n-type nitride semiconductor layer 5 and a second nitride semiconductor layer 6 are grown on the n-type contact layer.

The first nitride semiconductor layer 5 is a nitride semiconductor made of $Al_xGa_{1-x}N$ ($0 \leq X \leq 1$) formed as a single layer. Otherwise this layer may be formed as non-doped single layer or a single layer doped with an n-type impurity, or a multilayer structure using thereof.

For the second n-type nitride semiconductor layer 6, the composition is not specifically limited, however, it is preferable to be formed as a superlattice layer. The concentration of the n-type impurity is not specifically limited, however, it is preferably from $1 \times 10^{17}$ to $1 \times 10^{20}/cm^3$, and more preferably from $1 \times 10^{18}$ to $1 \times 10^{19}/cm^3$. Moreover, a gradient in the n-type impurity concentration may be applied.

An active layer 7 used in the present invention has a quantum well structure comprising at least a well layer made of $Al_aIn_bGa_{1-a-b}N$ ($0 \leq a \leq 1$, $0 \leq b \leq 1$, $a+b \leq 1$) and a barrier layer made of $Al_cIn_dGa_{1-c-d}N$ ($0 \leq c \leq 1$, $0 \leq d \leq 1$, $c+d \leq 1$). The nitride semiconductor used for the active layer may be either of non-doped, doped with an n-type impurity, or doped with a p-type impurity. However, a non-doped nitride semiconductor or a nitride semiconductor doped with a p-type impurity is preferably used, because the light emitting device with high power can be obtained.

More preferably, the output power and the luminous efficiency of the light emitting device can be enhanced by making the well layer undoped and the barrier layer doped with a n-type impurity. Moreover, a wavelength region which is difficult to obtain with a conventional InGaN well structure, specifically, in the vicinity of 365 nm which is the bandgap energy of GaN, or shorter wavelength thereof, can be obtained by including Al in the well layer of the light emitting device.

The thickness of the well layer is preferably from 1 nm to 30 nm inclusive, more preferably from 2 nm to 20 nm inclusive, further preferably from 3.5 nm to 20 nm inclusive. This is because when the thickness is less than 1 nm, a good function as a well layer can not be obtained, and when the thickness is greater than 30 nm, the crystallinity of the quaternary mixed crystal of InAlGaN declines. Also, when the thickness is 2 nm and above, a layer having a relatively uniform quality without significant difference in the thickness can be obtained. When the thickness is 20 nm and below, occurrence of crystal defects can be prevented and a crystal growth become possible. Moreover, the output power can be improved by making the film thickness equal or more than 3.5 nm. This means that by increasing the well layer thickness, emission-recombination is obtained owing to high luminance efficiency and high internal quantum efficiency in response to numerous carrier injection such as in a LD which is driven by a large current. This is especially effective in a multiple quantum well structure.

In a single quantum well structure, the effect of enhancing power output can be obtained in the same way as described above, by making the film thickness equal or more than 5 nm. Moreover, the number of the well layers is not specifically limited, however, when it is 4 or more, it is preferable to make the thickness of the well layer 10 nm or less, for controlling the thickness of the active layer low.

This is because when the thickness of each layer comprising the active layer becomes thick, the entire thickness of the active layer becomes thick and causes Vf to rise. Moreover, it is preferable that a barrier layer is doped with a p-type or an n-type impurity, or undoped, as in the well layer, and it is more preferable that the barrier layer is doped with an n-type impurity or undoped.

For example, an n-type impurity is doped in the barrier layer, the concentration of at least $5 \times 10^{16}/cm^3$ or higher is necessary. For example, for an LED, it is preferably $5 \times 10^{16}/cm^3$ or higher and $2 \times 10^{18}/cm^3$ or lower. For high output LED and LD, it is preferably $5 \times 10^{17}/cm^3$ or higher and $1 \times 10^{20}/cm^3$ or lower, more preferably $1 \times 10^{18}/cm^3$ or higher and $5 \times 10^{19}/cm^3$ or lower.

In this case, it is preferable to grow the well layer without substantially including an n-type impurity or undoped. In addition, when an n-type impurity is doped in the barrier layer, all barrier layers in the active layer may be doped, or a part of the barrier layers may be doped, while apart of the barrier layers maybe undoped. Here, when some of the barrier layers are doped with an n-type impurity, it is preferable to dope the layers disposed to the n-type layer side in the active layer.

Next, a p-type nitride semiconductor layer 8 is formed on the active layer. For the p-type nitride semiconductor layer 8, $Al_kGa_{1-k}N$ ($0 \leq k < 1$) is used. Especially when it is used for a LD device, $Al_kGa_{1-k}N$ ($0 < k < 0.4$), a composition which has a higher band gap energy than that of the active layer and capable of containing the carriers in the active layer, is preferable. This film thickness is not specifically limited, however, it is preferably from 0.01 to 0.3 $\mu$m, more preferably from 0.04 to 0.3 $\mu$m. Moreover, the p-type impurity concentration is from $1 \times 10^{18}$ to $1 \times 10^{21}/cm^3$, and preferably from $1 \times 10^{19}$ to $1 \times 10^{21}/cm^3$.

The bulk resistance can be reduced without deteriorating crystallinity when the p-type impurity concentration is in the above-mentioned range. The p-type semiconductor layer can be either a single layer or a multilayer (superlattice structure). In case of a multilayer, it is only required that a multilayer is made of above-mentioned $Al_kGa_{1-k}N$ and a nitride semiconductor layer which has a smaller band gap energy than $Al_kGa_{1-k}N$. For example, when forming a p-type semiconductor layer with a super lattice structure, the crystallinity can be improved by forming a superlattice structure with $Al_kGa_{1-k}N$ ($0 < k < 0.4$) and $In_lGa_{1-l}N$ ($0 \leq l < 0.2$).

The thickness of each layer constructing a superlattice structure is preferably 100 Å or less, more preferably 70 Å or less, and further preferably from 10 Å to 40 Å. Also, one or the other of the layers having the greater band gap energy or the smaller band gap energy can be doped with a p-type impurity. In addition, when both layers having the greater band gap energy and the smaller band gap energy are doped, the doping amount can be either the same or different.

Next, a p-type contact layer 9 is formed on the p-type semiconductor layer. For the p-type contact layer, $Al_fGa_{1-f}N$ (0≦f<1) is used. Especially, a good ohmic contact with the p-electrode which is an ohmic electrode become possible by forming the p-type contact layer with $Al_fGa_{1-f}N$ (0≦f<0.3). The concentration of the p-type impurity is preferably $1 \times 10^{17}/cm^3$ or greater. More preferably, the p-type impurity concentration is $1 \times 10^{18}/cm^3$ or greater. Further preferably, the concentration of the p-type impurity is $1 \times 10^{19}/cm^3$ or greater.

Also, it is preferable that the p-type impurity has a concentration gradient in which the p-type impurity concentration increases and the mixed crystal ratio of Al decreases at the conductive substrate side. In this case, the concentration gradient can be changed either continually or stepwise. For example, the p-type contact layer can be constructed with a first contact layer which is in contact with the ohmic electrode and has a high p-type impurity concentration and a low Al composition ratio, and a second contact layer which has a low p-type impurity concentration and a high Al composition ratio. A good ohmic contact can be obtained with the first p-type contact layer and self-absorption can be prevented with the second p-type contact layer.

After growing the nitride semiconductor on the substrate as described above, the wafer is taken out from the reaction apparatus and subjected to a heat treatment at 400° C. and above in an atmosphere containing oxygen and/or nitrogen. By this, the hydrogen bonding to the p-type layer is removed and the p-type nitride semiconductor layer showing the p-type conductivity is formed.

Then, a p-electrode 10 which obtains ohmic contact is formed on the p-type contact layer. A method such as CVD method, sputter technique, and evaporation method is used to form the p-type electrode.

The p-electrode is formed in a shape such as rectangle, stripe, square, or grid. Other p-electrodes are such that formed on the entire surface of the p-type semiconductor layer (FIG. 4), formed with dot-shaped hollows, formed in a shape such as lozenge, a parallelogram, a mesh (FIG. 6A), stripes, comb-shaped, a plurality of branches divided out from a stripe (FIG. 6B), a plurality of stripe-shaped branch electrodes which are electrically connected and also having hollows on the p-type electrode (FIG. 6C), or a circle. The light extract efficiency can be further improved by using those p-type electrode structures in combination with the above-mentioned substrate. A protective film 31 may be formed on the p-electrode or the n-electrode.

It is preferable to form a plurality of openings with approximately the same shape. By this, the formation of the openings can be made with ease, and a uniform in-plane distribution of light emission can be obtained. In addition, the plurality of openings are preferably formed with approximately the same area. By this, the in-plane distribution of light emission also becomes uniform.

Moreover, an n-electrode 12 is formed on the surface of the n-type contact layer. W/Al, Ti/Al, Ti/Al/Ni/Au, W/Al/W/Pt/Au, Al/Pt/Au etc. are used for the n-electrode. The film thickness of the n-electrode is from 0.1 μm to 1.5 μm. For the n-electrode, a pad electrode for bonding and an electrode for obtaining ohmic contact with the n-side may be formed approximately the same shape simultaneously. The ohmic electrode may also be used as the n-pad electrode.

The p-electrode 10 is an ohmic electrode which forms ohmic contact with the p-type layer on the surface of the p-type nitride semiconductor layer and injects electric current into the device. Typically, in the nitride semiconductor device, a p-pad electrode 11 is formed besides the p-electrode. For example, a p-pad electrode 11 for bonding which is to be connected by wire bonding is formed, and electrically connected to the p-electrode that is an ohmic electrode. This p-pad electrode can be disposed either on the p-side layer or on the exterior portion of the p-side layer by metallic wiring. For example, the p-pad electrode can be disposed on the surface where the n-side electrode to be formed via the insulating film. In the case where the p-pad electrode is formed on the p-side layer, it can be formed to overlap a portion of the p-electrode or can be formed on the p-electrode.

The p-pad electrode is an electrode to be mounted by wire etc., so that its film thickness is not specifically limited provided that the thickness is sufficient to keep the semiconductor device unharmed when bonding. It is necessary to form the p-pad electrode as small as possible when extracting light from the face where the p-pad electrode is disposed.

A material having a high adhesion is selected for the p-pad electrode 11. The material such as Co, Fe, Rh, Ru, Ti, V, Cr, Zr, Nb, Mo, Hf, Ta, W, Re, Mn, Al, Zn, Pt, Au, Ru, Pd, and Rh can be used.

It is preferable to use at least one selected from the group consisting of Ag, Al, Pt, Cu, Ni, Ti, Au, W, Nb, Mo, Hf, and Rh, or an oxide or a nitride thereof. It is more preferable to use at least one selected from the group consisting of Ag, Al, and Pt. A single layer, an alloy, or a multilayer can be used for the p-pad electrode. In addition, these materials can be used not only for the p-pad electrode but for the n-pad electrode.

By performing a heat treatment after forming the electrode on the surface of the nitride semiconductor layer, the electrode become alloy and a good ohmic contact with the semiconductor layer can be obtained. Also, the contact resistance between the semiconductor layer and the electrode can be reduced.

The preferable temperature range for the heat treatment is from 300° C. to 1200° C., more preferably from 300° C. to 900° C., and further preferable from 450° C. to 650° C. The heat treatment condition other than described above is an atmosphere in which atmosphere gas contains oxygen and/or nitrogen. In addition, a heat treatment in the atmosphere containing an inert gas such as argon, or in the ambient condition is also possible.

In the semiconductor device according to the present invention, a protective film 13 can be formed continuously to the side face of the device where the nitride semiconductor layers are laminated. The protective film 13 can be made by $SiO_2$, $ZrO_2$, $TiO_2$, $Al_2O_3$, an oxide containing at least one element selected from the group consisting of V, Zr, Nb, Hf, Ta, or SiN, NB, SiC, AlN, AlGaN and the like.

It is preferable that the protective film is insulative, so that the semiconductor with a high reliability can be obtained. Especially, the corrosion of the electrode can be efficiently prevented by forming the insulative protective film on the p-type layer other than the electrode forming portion thereof.

Figure 3:
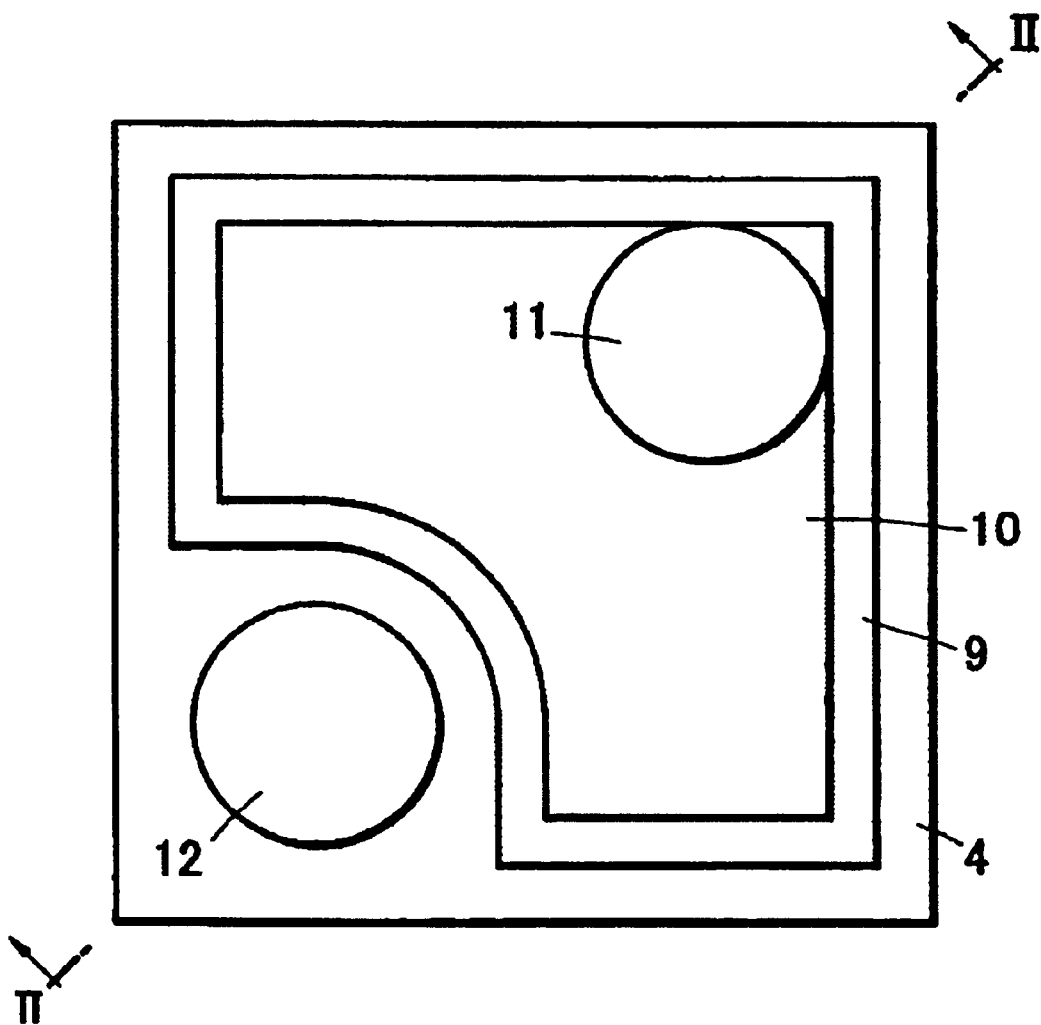
FIG. 3 is a plan view on the top face showing the structure of the nitride semiconductor device according to an embodiment of the present invention.

The chip-shaped semiconductor device is made by way of scribing or dicing etc. of the above-mentioned nitride semiconductor device (FIG. 2). In a plan view of the nitride semiconductor device as shown in FIG. 3, the p-electrode 10 is formed on the approximately entire face of the p-type nitride semiconductor layer.

Figure 4:
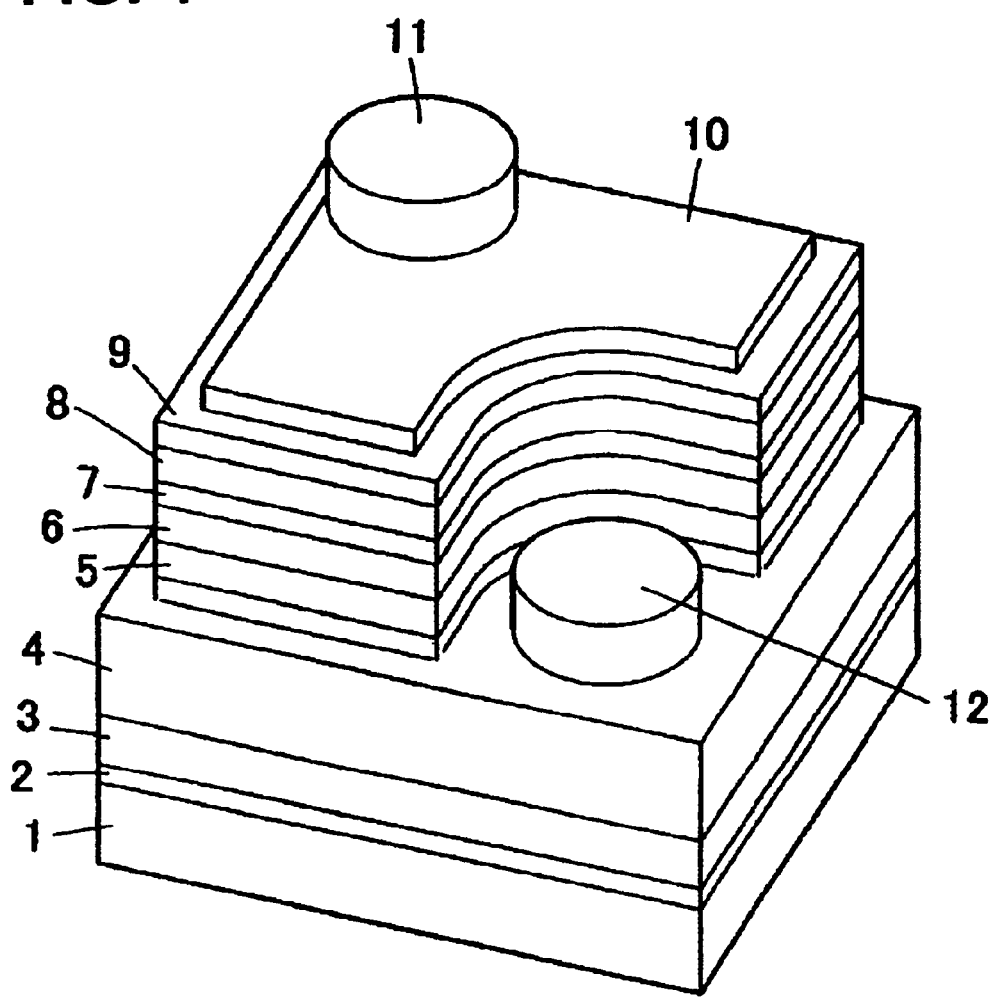
FIG. 4 is a perspective view showing the structure of the nitride semiconductor device according to an embodiment of the present invention.

A perspective view of the nitride semiconductor device is shown in FIG. 4. The semiconductor device with the p-electrode made by Rh/Ir can make the Vf 3.4 or less and the contact resistivity 1/10 or less compared with an electrode made of Ni/Au or Rh and the like.

Embodiment 2

Figure 5:
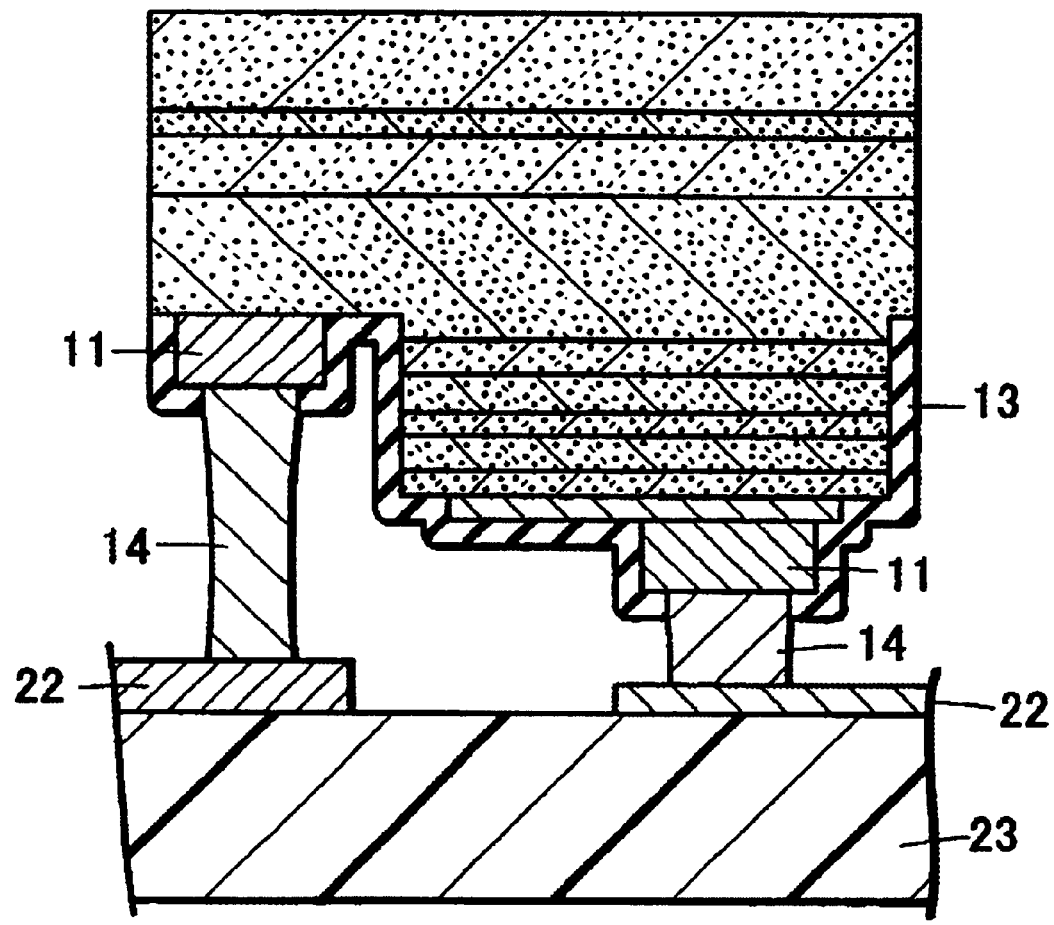
FIG. 5 is a schematic cross-sectional view showing the structure of the nitride semiconductor device according to an embodiment of the present invention.

In the embodiment 1, as shown in FIG. 5, the electrode forming face of the nitride semiconductor layer is made to the light extract face, however, the substrate side can be also made to the light extract face in the embodiment 2. A face-down structure is employed where the protective film 13 is formed on the nitride semiconductor except for the face on which the electrode is disposed, and a metallizing layer (bump) 14, other than using a wire, is disposed for connecting to the external electrode etc.

The metallizing layer 14 is electrically connected to a lead electrode 22 disposed on a mounting substrate 23.

Figure 7:
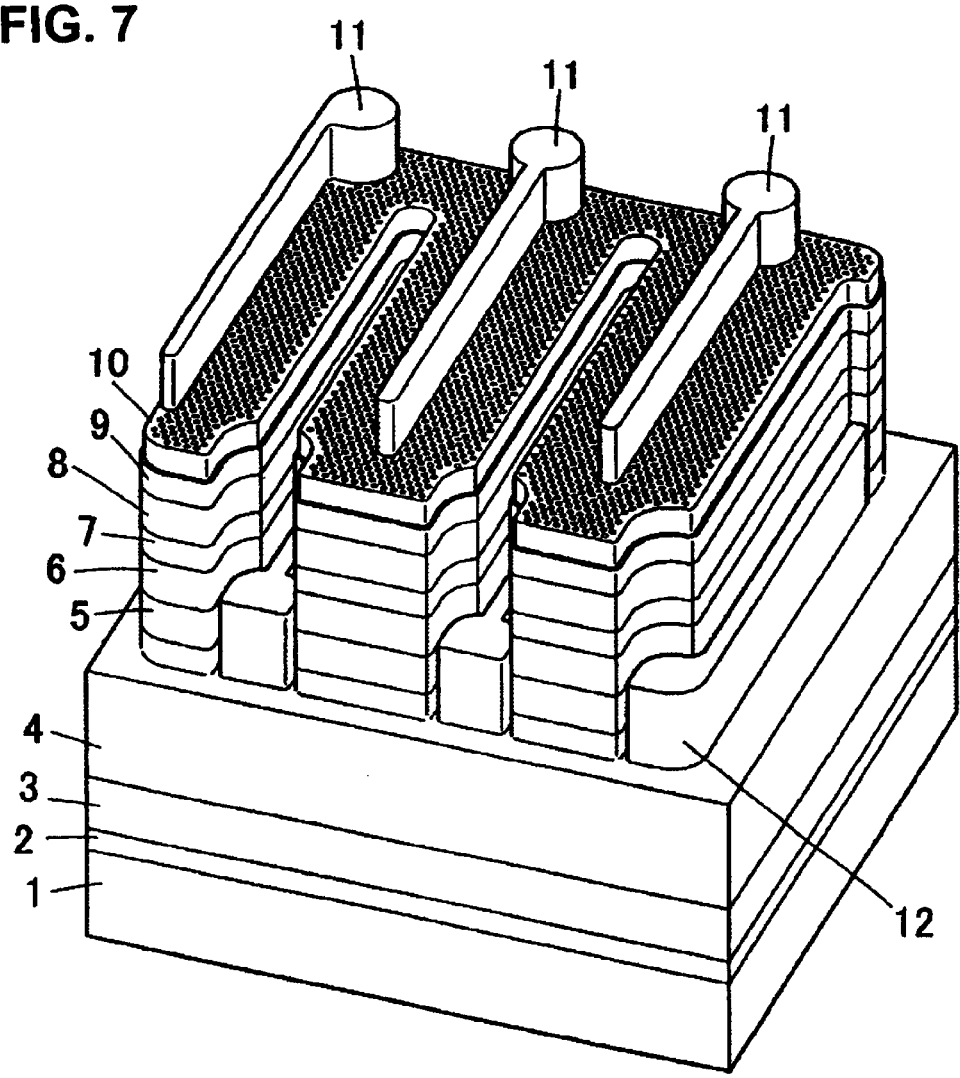
FIG. 7 is a perspective view showing the structure of the nitride semiconductor device according to an embodiment of the present invention

To make the size of the nitride semiconductor device equal or larger than 1 mm$^2$, the p-pad electrodes 11 and the n-electrodes 12 are formed on a plurality of positions as shown in the FIG. 7. A portion of the p-pad electrodes 11 and the n-electrodes 12 are formed wider for forming the metallizing layers 14. Also, the portions of the p-pad electrodes 11 and the n-electrodes 12 on which the metallizing layers 14 to be formed are facing each other.

Figure 6A:
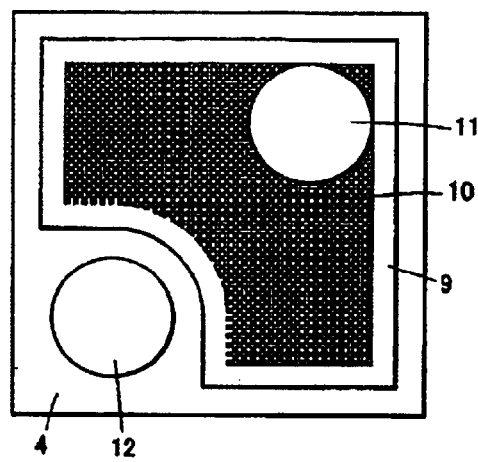
FIGS. 6A–6C are schematic views showing the electrode structure of the nitride semiconductor device according to an embodiment according to the present invention.
Figure 6B:
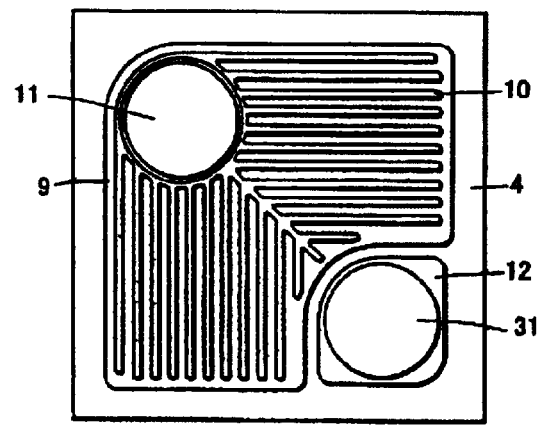
Figure 6C:
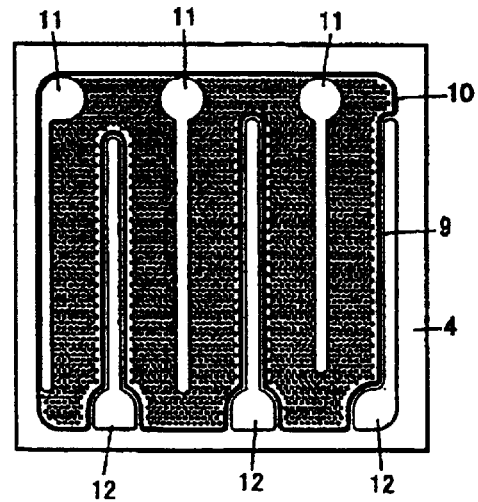

Moreover, as shown in FIGS. 6C and 7, each of the p-pad electrode and/or the n-electrode is extended in a branch-shape in the side-face direction that respectively facing. By this construction, a high current can be applied uniformly even to the nitride semiconductor device of 1 mm$^2$ and greater.

Figure 8:
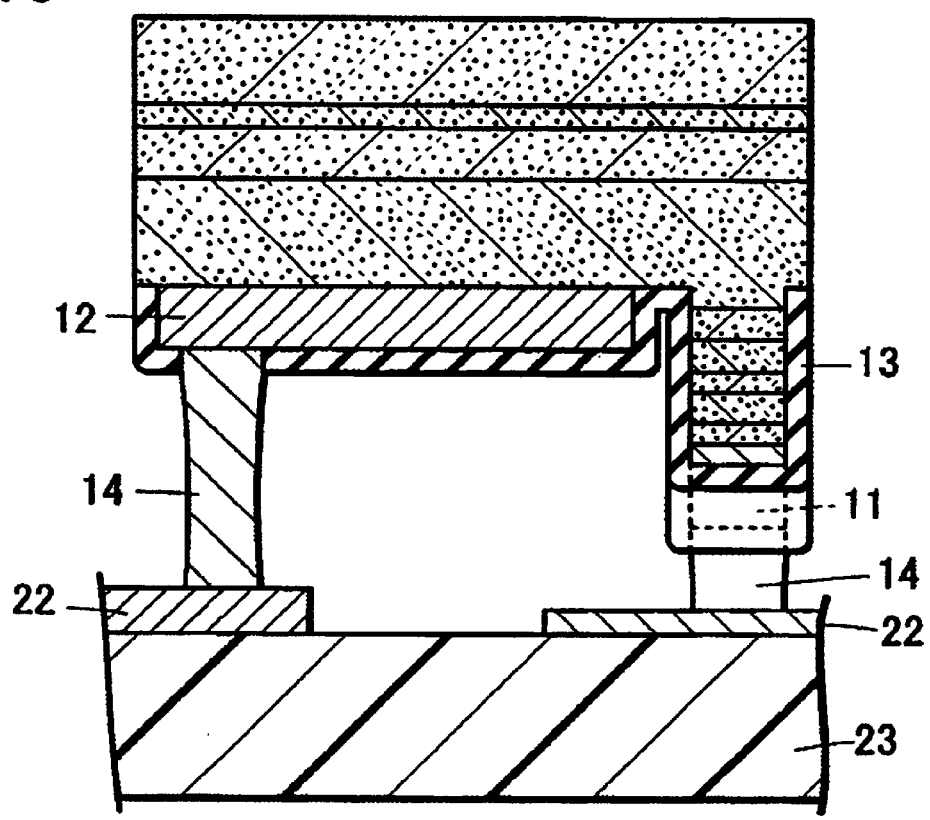
FIG. 8 is a schematic cross-sectional view showing the structure of the nitride semiconductor device according to an embodiment of the present invention.

FIG. 8 shows the nitride semiconductor element shown in FIG. 7 being mounted face-down. The light extract efficiency is improved by making the substrate side as the light extract face. For instance, the pad electrode is formed in an elliptic shape. This metallizing layer is comprised of a material such as Ag, Au, Sn, In, Bi, Cu, and Zn.

In the face-down mounting, heat is applied to the pad electrode so that the volume thereof increases and a pressure is generated. Therefore, the pad electrode material tends to flow out in the side face direction. However, in the nitride semiconductor device according to the present embodiment, an alloying occurs by using the above-mentioned electrode, so that such a problem can be prevented. Moreover, by using the structure according to the present invention, good heat dissipation and an improved reliability can be obtained.

Embodiment 3

Figure 9A:
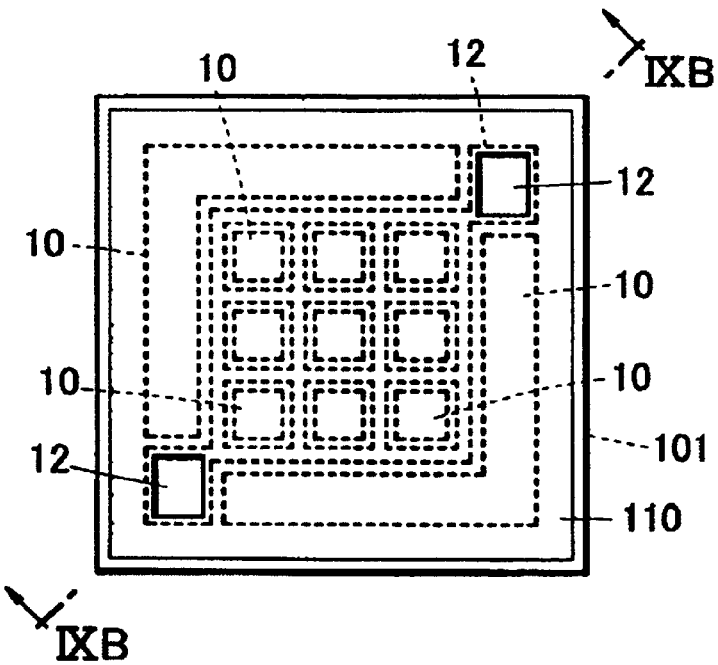
FIGS. 9A–9C are schematic views showing the structure of the nitride semiconductor device according to an embodiment of the present invention.

The nitride semiconductor device according to the present embodiment has a structure where the conductive layer, the p-type nitride semiconductor layer via the p-electrode, the active layer, and the n-type nitride semiconductor layer are disposed on the support substrate in sequence, and the n-electrode is disposed thereon. The nitride semiconductor device has a counter electrode structure (FIG. 9) where the p-electrode and the n-electrode are facing each other across the nitride semiconductor layer.

In the above-mentioned nitride semiconductor device, the n-electrode side becomes the light extract face. The resistance of the n-type layer is low in the nitride semiconductor (especially in the GaN-based semiconductor) so that the size of the n-electrode can be reduced. The light extract efficiency is improved because making the n-electrode smaller, the area that interrupts light can be reduced.

A manufacturing process of the nitride semiconductor device according to the present embodiment will be described below with reference to the accompanying drawings.

First, a nitride semiconductor 20 having at least an n-type nitride semiconductor layer, an active layer, and a p-type nitride semiconductor layer is grown on a substrate 1. Afterwards, above-mentioned p-electrode 10 is formed on the p-type nitride semiconductor layer. The light extract efficiency can be improved by forming the p-electrode with a pattern such as a rectangular, a square, a grid, dots, a diamond, a parallelogram, a mesh, a stripe, and a net, a plurality of branches diverges from one of grids and each having further branches. It is preferable to form the center portion in a grid shape and its periphery being surrounded by two L-shapes. With this configuration, a large current become applicable.

Next, a first protective layer 103 is disposed on the opening of the p-electrode which is the exposed portion of the nitride semiconductor. A conductive layer 102 is then disposed on the p-electrode and the first protective layer. A support substrate will be adhered to the surface of the conductive layer. For the conductive layer, a three-layer structure made of an adhesion layer, a barrier layer, and a eutectic layer is preferable. Meanwhile, a support substrate 101 is prepared. It is preferable to form a conductive layer 102 on the surface of the support substrate as well.

The above-mentioned conductive layer is formed with Pt, Au, Sn, Pd, In, Ti, Ni, W, Mo, Au—Sn, Sn—Pd, In—Pd, Ti—Pt—Au, Ti—Pt—Sn, Ti—Pt—Pd or Ti—Pt—AuSn, Ti—Pt—AuSn—Au, W—Pt—Sn, RhO—Pt—Sn, RhO—Pt—Au, and RhO—Pt—(Au,Sn), etc.

A conductive layer made of multiple layers is grown from the p-electrode side. A eutectic can be formed at a low temperature in this conductive layer and the melting point rises after the eutectic is formed, so that diffusion toward the p-electrode can be prevented. Moreover, heat can be released efficiently to the support substrate through the conductive layer.

In the support substrate 101 which is adhere to the nitride semiconductor element, the linear thermal expansion coefficient is from 4 to 10 ($\times 10^{-6}$/K) and it is preferable that at least one selected from the group consisting of Cu, Mo, and W is included. When Cu is included in the support substrate described above, its concentration is adjusted to be 50% or less. When Mo is included in the substrate described above, its concentration is adjusted to be 50% and above. When W is included in the substrate described above, its concentration is adjusted to be 70% and above. Specific examples of the support substrate are metals such as Cu—W, Cu—Mo, AlSiC, AlN, Si, SiC, Cu-diamond, and a ceramic composite and the like.

Moreover, the general formula may be described as $Cu_xW_{1-x}$ ($0 \leq X \leq 30$), or $Cu_xMo_{1-x}$ ($0 \leq X \leq 50$) etc. When the chip is mounted on the circuit such as a printed wiring board, it is advantageous to use AlN as the support substrate because it is an insulating substrate. The advantage of using Si is a low price and easiness to be made into the chips. The preferable film thickness of the support substrate is from 50 to 500 μm. Heat dissipation can be improved by making the support substrate thin in this range.

The nitride semiconductor device and the support substrate are then bonded together by way of heating pressure welding. The bonded surfaces of the conductive layers are alloyed. Specifically, heat of 150° C. or greater is applied while pressing. This bonding process is performed by way of heating pressure welding. The preferable temperature for heating pressure welding is from 150° C. to 350° C. At the temperature 150° C. and above, diffusion of metal in the conductive layer is accelerated and a eutectic having a uniform density distribution can be formed, and the adhesiveness between the nitride semiconductor device and the support substrate can be improved. At the temperature 350°

C. and above, the range of diffusion extends to the bonding region and adhesion decreases.

By bonding, p-electrode/Ti—Pt—AuSn—Pt—Ti/support substrate is made. The other examples are p-electrode/RhO—Pt—AuSn—Pt—Ti/support substrate, p-electrode/Ti—Pt—AuSn—Au/support substrate, p-electrode/Ti—Pt—PdSn—Pt—Ti/support substrate, and p-electrode/Ti—Pt—AuSn—Pt—RhO/support substrate. Thus, an alloy having strong bonding strength against cracking is formed. By making the conductive layer eutectic, a low temperature bonding becomes possible and the adhesion also becomes strong. Bonding at the above-mentioned temperature provides a relaxation effect against a curvature.

The substrate 1 is removed thereafter. The substrate is removed by way of excimer laser irradiation, polishing, grinding, or chemical polishing etc. According to the above-mentioned process, the exposed face of the nitride semiconductor, which is a mirror surface, is formed.

Thereafter, periphery etching is carried out by way of RIE etc. and the peripheral portion of the nitride semiconductor layer is removed for making the nitride semiconductor device into the chips. Then, the grooves are formed between the chips so as to divide the nitride semiconductor layer into the chips, and the n-electrode 12 is disposed on the exposed face of the n-type nitride semiconductor layer.

The examples of the n-electrode other than those mentioned above are Ti—Al—Ni—Au, W—Al—W—Pt—Au, and Al—Pt—Au etc. The film thickness of the n-electrode is adjusted to be from 0.1 to 1.5 $\mu$m. Here, a recess and a protrusion can be formed on the exposed face of the n-type nitride semiconductor layer except for the portion where the n-electrode is disposed.

The cross-sectional shape of the recess and the protrusion may be of a mesa-structure or an inverse mesa-structure. The planar shape of the recess or the protrusion may be of a round shape, a hexagon, a triangle, an island shape, a grid, a rectangle, a circle, or a polygon. The depth of the recesses is 0.2 to 3 $\mu$m, preferably from 1.0 to 1.5 $\mu$m. Because the light extract efficiency can not be improved with the depth of less than 0.2 $\mu$m, and the resistance in the lateral direction increases with the depth greater than the above-mentioned range. Moreover, when the recesses are made by cutting out in a round shape or a polygonal shape, the output power can be improved while maintaining the low resistance.

Figure 9B:
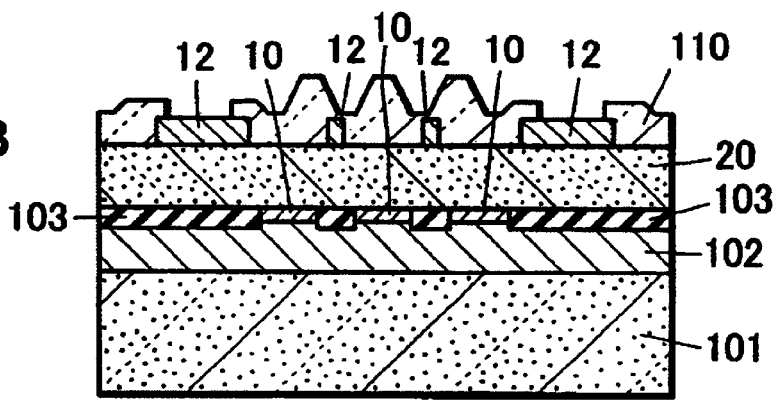
Figure 9C:
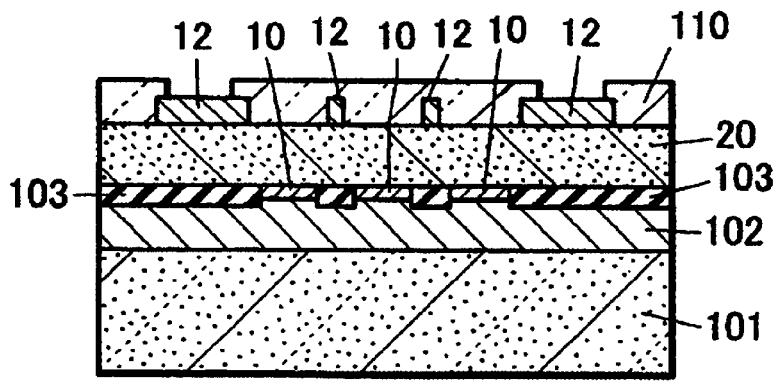

Afterwards, the top face of the nitride semiconductor device is covered with a second protective film 110 except for the wire bonding region, and the nitride semiconductor devices (FIG. 9A) are made by dicing. FIG. 9C shows the cross-section of the nitride semiconductor device shown in FIG. 9A. Moreover, a recess and a protrusion can be formed on the second protective film (FIG. 9B). The light extract efficiency can be improved accordingly. The second protective film 110 is an insulating film made of $SiO_2$, SiN, $Si_xO_yN_{1-x-y}$, $Nb_2O_5$, $Al_2O_3$, $ZrO_2$, $TiO_2$ and the like.

Embodiment 4

A white light emitting device of high power output can be obtained by disposing a phosphor mixed with a resin on the surface of the chip of the nitride semiconductor device made in the above-described embodiment.

An example of the above-mentioned phosphor will be described below. Specific examples of green emission phosphors are $SrAl_2O_4$:Eu, $Y_2SiO_5$:Ce,Tb, $MgAl_{11}O_{19}$:Ce,Tb, and $Sr_7Al_{12}O_{25}$:Eu, (at least one of Mg, Ca, Sr, and Ba)$Ga_2S_4$:Eu. For a blue emission phosphor, $Sr_5(PO_4)_3$Cl:Eu, $(SrCaBa)_5(PO_4)_3$Cl:Eu, $(BaCa)_5(PO_4)_3$Cl:Eu, (at least one of Mg, Ca, Sr, and Ba)$_2B_5O_9$Cl:Eu,Mn, and (at least one of Mg, Ca, Sr, and Ba) $(PO_4)_6Cl_2$:Eu,Mn are cited.

For a red emission phosphor, $Y_2O_2S$:Eu, $La_2O_2S$:Eu, $Y_2O_3$:Eu, $Gd_2O_2S$:Eu are cited. Especially, by including YAG, a white light can be emitted, and the application such as lighting can be extended greatly. YAG is $(Y_{1-x}Gd_x)_3(Al_{1-y}Ga_y)_5O_{12}$:R (R is at least one selected from Ce, Tb, Pr, Sm, Eu, Dy, and Ho, 0<R<0.5), for example, $(Y_{0.8}Gd_{0.2})_3Al_5O_{12}$: Ce, $Y_3(Al_{0.8}Ga_{0.2})_5O_{12}$: Ce.

In the present embodiment, a nitride-based phosphor is specifically used as the phosphor which emits a reddish light. However, in the present invention, a light emitting device can be equipped with the above-mentioned YAG phosphor and a phosphor capable of emitting reddish light.

A phosphor capable of emitting such a reddish light is a phosphor which is excited by a light having a wavelength from 400 to 600 nm and emits light. For example, $Y_2O_2S$:Eu, $La_2O_2S$:Eu, CaS:Eu, SrS:Eu, ZnS:Mn, ZnCdS:Ag, Al, ZnCdS:Cu, and Al etc. can be cited. Thus, the color rendering properties of the light emitting device can be improved by using a phosphor capable of emitting reddish light together with the YAG phosphor.

By selecting the phosphors described above, the light emitting device having a high light efficiency with various emission wavelengths can be obtained.

EXAMPLE 1

Now, Example 1 will be described below based on the light emitting diode shown in FIG. 1. The present invention is not limited to this example and can be applied to all nitride semiconductor devices (such as a laser diode, a solar battery, a optical sensor, a transistor, and a power device etc.) having an electrode formed on the p-type nitride semiconductor layer.

First, a substrate 1 made of sapphire (c-face) is set to a reaction vessel for MOCVD. After substituting the contents of the vessel with nitrogen sufficiently, the temperature of the substrate is risen to 1050° C. while supplying nitrogen flow to clean the substrate. Although sapphire (c-face) is used in the present example, a nitride semiconductor substrate such as GaN, AlN, AlGaN etc., or a foreign substrate different from the nitride semiconductor can be used.

For a foreign substrate, for example, an insulating substrate such as sapphire with c-face, r-face or a-face as the principal plane and spinel ($MgAl_2O_4$), or a semiconductor substrate such as SiC (including 6H, 4H, and 3C), Si, ZnO, GaAs, and ZnS, a metal crystal such as $ZrB_2$ can be used. Sapphire and spinal are used preferably.

Moreover, a foreign substrate may be of off-angled. Especially, it is preferable to use a foreign substrate being off-angled stepwise, because the foundation layer of the nitride semiconductor can be grown with a good crystallinity.

The temperature is then lowered to 510° C., a buffer layer (not shown in the figures) made of GaN is grown on the substrate 1 to a film thickness of approximately 100 angstrom, by using hydrogen as a carrier gas, TMG (trimethyl gallium) and ammonia as a source gas. In addition, this buffer layer is omissible depend on the substrate and the growth method. Moreover, AlGaN including Al in a small ratio can be used as this buffer layer.

After growing the buffer layer, only TMG is stopped and the temperature is raised to 1050° C. After the temperature raised to 1050° C., undoped GaN layer 2 is grown to the thickness of 1 $\mu$m using TMG and ammonia gas as the source gas.

Next, an n-side contact layer 3 made of GaN doped with Si to $4.5 \times 10^{18}/cm^3$ is grown to the thickness of 5 $\mu$m by using TMG and ammonia gas as the source gas, and silane gas as an impurity gas. Although Si is used in the present example, the n-type impurity is not specifically limited and a Group IV element such as Si, Ge, Sn, S, O, Ti, and Zr and a Group VI element etc. can be used suitably. Si, Ge, and Sn are used preferably, and Si is used more preferably.

Next, only silane gas is stopped and a lower layer made of undoped-GaN is grown to the thickness of 3000 angstroms at 1050° C. by using TMG and ammonia gas. Subsequently, at the same temperature, silane gas is added and a middle layer made of GaN doped with Si to $4.5 \times 10^{18}/cm^3$ is grown to the thickness of 300 angstroms. Further, subsequently, only silane gas is stopped and at the same temperature, an upper layer made of undoped GaN is grown to the thickness of 50 angstroms. Thus, an n-side first multilayer 4 consists of three layers having a thickness of 3350 angstroms is grown.

Next, at the same temperature, a nitride semiconductor layer made of undoped GaN is grown to the thickness of 40 angstroms. Then, the temperature is adjusted to 800° C., a nitride semiconductor layer made of undoped $In_{0.1}Ga_{0.9}N$ is grown to the thickness of 20 angstroms, by using TMG, TMI (trimethyl indium), and ammonia. These operations are repeated to alternately laminate 10 layers of each. Then, a nitride semiconductor layer made of undoped GaN is grown to the thickness of 40 angstroms. Thus, an n-side second multilayer 5 having the thickness of 640 angstroms is grown.

Next, a barrier layer made of undoped GaN is grown to the thickness of 250 angstroms by using TMG and ammonia. Subsequently, at the same temperature, TMI is added and a well layer made of $In_{0.3}Ga_{0.7}N$ is grown to the thickness of 30 angstroms. These operations are repeated to alternately laminate 6 layers of each. Then, a barrier layer made of undoped GaN is grown to the thickness of 25 angstroms. Thus, an active layer 6 having a multiquantum well structure with the thickness of 1930 angstroms is grown.

Next, at 1050° C., a nitride semiconductor layer made of $Al_{0.15}Ga_{0.05}N$ doped with Mg to $5 \times 10^{19}/cm^3$ is grown to the thickness of 40 angstroms using TMG, TMA, ammonia, $Cp_2Mg$ (cyclopentadienyl magnesium). Subsequently, the temperature is adjusted to 800° C. and a nitride semiconductor layer made of $In_{0.03}Ga_{0.97}N$ doped with Mg to $5 \times 10^{19}/cm^3$ is grown to the thickness of 25 angstroms using TMG, TMI, ammonia and $Cp_2Mg$.

These operations are repeated to alternately laminate 5 layers of each. Then, a nitride semiconductor layer made of $Al_{0.15}Ga_{0.85}N$ doped with Mg to $5 \times 10^{19}/cm^3$ is grown to the thickness of 40 angstroms. Thus, a p-side multilayer 7 having a multiquantum well structure with the thickness of 365 angstroms is grown.

Next, at 1050° C., a p-side contact layer 8 made of GaN doped with Mg to $5 \times 10^{20}/cm^3$ is grown to the thickness of 1200 angstroms using TMC, ammonia, and $Cp_2Mg$. After the reaction is completed, the temperature is lowered to room temperature. Then, in a nitrogen atmosphere, the wafer is annealed in the reaction vessel at 600° C., so as to make the p-type layer further low-resistance.

After annealing, the wafer is removed from the reaction vessel, and etching is carried out from the p-side contact side. Then, W is laminated on the exposed n-side contact layer to the thickness of 100 angstroms and Al is laminated thereon to the thickness of 1000 angstroms. Thus; an n-electrode made of W/Al is formed.

Next, rhodium (Rh) is laminated on the entire face of the p-type contact layer, a remained portion without being etched, to the film thickness of 400 angstroms, and iridium is laminated thereon to the thickness of 500 angstroms. Thus, a p-electrode made of Rh/Ir is formed. After forming the electrode, annealing is carried out at 600° C. in a nitrogen atmosphere.

Finally, the light emitting diode devices having 350 μm on a side were obtained by dividing the wafer. Vf (forward voltage) of the resulting device was 3.5 V at IF (forward current) of 20 mA, and an excellent ohmic contact with the p-type nitride semiconductor layer was obtained.

The specific contact resistivity between the p-type nitride semiconductor layer and Rh/Ir was measured by using the TLM technique and compared to the specific contact resistivitys of the cases where the p-electrodes consisting of Rh, Rh/Pt, Rh/Ru, or Rh/Au were formed on the n-type nitride semiconductor, as shown in FIG. 1. Values are given in the ratio relative to the value when only Rh is used for the electrode in contact with the p-type nitride semiconductor layer, which is set to 1. Decline in the specific contact resistivity is seen in the electrode having Rh as the first layer and Ir as the second layer. Decline in the specific contact resistivity is also seen in the electrode having Rh as the first layer and Au as the second layer. However, it is unfavorable for the LED of the nitride semiconductor system because Rh forms an alloy with Au and increases absorption of light having a shorter wavelength.

EXAMPLE 2

The light emitting diode device is obtained in the same manner as Example 1, except for forming the opening in the p-electrode 10 as shown in FIG. 6A. Vf of the resulting device was 3.5 V at If of 20 mA, and an excellent ohmic contact was obtained between the p-type nitride semiconductor layer and the electrode. Light is extracted through the opening of the electrode so that the optical output was increased by approximately 20% compared to Example 1.

COMPARATIVE EXAMPLE 1

The light emitting diode device was obtained in the same manner as Example 1, except for disposing Ni and Au as the p-electrode 10 to the thickness of 200 angstroms. The p-electrode 10 has the translucency in the resulting device. The optical output was decreased by about 20% due to light absorption in the electrode compared with Example 1.

COMPARATIVE EXAMPLE 2

The light emitting diode device was obtained in the same manner as Example 1, except for laminating Ni and Pt to the thickness of 200 angstroms as the p-electrode 10. The p-electrode 10 has the translucency in the resulting device. The optical output was decreased by about 20% due to light absorption in the electrode compared with Example 1.

COMPARATIVE EXAMPLE 3

The light emitting diode element was obtained in the same manner as Example 1, except for laminating only to the thickness of 400 angstroms as the p-electrode 10. The p-electrode 10 has the translucency in the resulting device. The optical output was decreased by about 20% due to light absorption in the electrode compared with example 1. Vf rose by about 0.1 V though the optical output was the same as in Example 1 due to the light absorption in the electrode.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Text of Japanese application No. 2002-246573 filed on Aug. 27, 2002, and Japanese priority application No. 2003-300714 filed on Aug. 26, 2003 are hereby incorporated by reference.

What is claimed is:

1. A nitride semiconductor device comprising:
   a p-type nitride semiconductor layer; and
   a p-electrode having an at least two-layer structure;
   wherein said p-electrode includes a rhodium layer disposed on said p-type nitride semiconductor layer and an iridium layer disposed on the rhodium layer.

2. The nitride semiconductor device according to claim 1, wherein said p-type nitride semiconductor layer is located below an n-type nitride semiconductor layer.

3. The nitride semiconductor device according to claim 1, wherein said nitride semiconductor device has a structure of a face-down configuration.

4. The nitride semiconductor device according to claim 1, further comprising a p-type nitride semiconductor layer disposed on said p-electrode which is disposed in contact with a substrate.

5. The nitride semiconductor device according to claim 1, wherein light is extracted from at least one of a surface of the substrate and a side surface of said device.

6. The nitride semiconductor device according to claim 1, wherein said p-electrode has a shape in two dimensions that is selected from the group comprising a rectangle, a stripe, a square, a gird, a shape with dot-shaped hollows, diamond, a parallelogram, a mesh, stripes, comb-shaped, a plurality of branches divided out from a stripe, and a circle.

7. The nitride semiconductor device according to claim 1, wherein in said p-electrode, a thickness of the rhodium layer is from 10 angstroms to 1000 angstroms.

8. The nitride semiconductor device according to claim 1, wherein in said p-electrode, a thickness of the iridium layer is from 10 angstroms to 1000 angstroms.

9. The nitride semiconductor device according to claim 1, wherein in said p-electrode, a thickness of the rhodium layer is from 10 angstroms to 1000 angstroms and a thickness of the iridium layer is from 10 angstroms to 1000 angstroms.

10. The nitride semiconductor device according to claim 1, wherein said p-electrode is annealed at a temperature of at least 300° C.

* * * * *